United States Patent
Craninckx

(10) Patent No.: US 6,943,600 B2
(45) Date of Patent: Sep. 13, 2005

(54) DELAY-COMPENSATED FRACTIONAL-N FREQUENCY SYNTHESIZER

(75) Inventor: Jan Frans Lucien Craninckx, Boutersem (BE)

(73) Assignee: STMicroelectronics Belgium NV, Zaventem (BE)

( * ) Notice: Subject to any disclaimer, the term of this patent is extended or adjusted under 35 U.S.C. 154(b) by 52 days.

(21) Appl. No.: 10/737,532

(22) Filed: Dec. 16, 2003

(65) Prior Publication Data

US 2004/0196108 A1 Oct. 7, 2004

(30) Foreign Application Priority Data

Dec. 23, 2002 (EP) .......................... 02-447268

(51) Int. Cl.[7] ................................ H03L 7/00
(52) U.S. Cl. .................. 327/157; 327/156; 331/16; 331/17
(58) Field of Search ................ 327/146–147, 327/156–158; 331/10–17; 455/180.3, 260

(56) References Cited

U.S. PATENT DOCUMENTS

| | | | | |
|---|---|---|---|---|
| 5,880,612 A | * | 3/1999 | Kim | 327/158 |
| 6,064,272 A | | 5/2000 | Rhee | |
| 6,094,082 A | * | 7/2000 | Gaudet | 327/270 |
| 6,359,950 B2 | | 3/2002 | Gossmann et al. | |
| 6,501,336 B2 | * | 12/2002 | Kim et al. | 331/10 |
| 6,693,496 B1 | * | 2/2004 | Lebouleux | 331/185 |
| 6,788,045 B2 | * | 9/2004 | Gauthier et al. | 324/76.53 |
| 6,870,411 B2 | * | 3/2005 | Shibahara et al. | 327/156 |
| 6,882,831 B2 | * | 4/2005 | Shi et al. | 455/116 |
| 2001/0033201 A1 | | 10/2001 | Canard et al. | |

FOREIGN PATENT DOCUMENTS

| | | |
|---|---|---|
| JP | 56169927 | 12/1981 |
| WO | WO 86/07219 | 12/1986 |

OTHER PUBLICATIONS

European Search Report dated May 14, 2003 for European Application No. 02–447268.0.

* cited by examiner

*Primary Examiner*—Dinh T. Lee
(74) *Attorney, Agent, or Firm*—Lisa K. Jorgenson; Stephen Bongini; Fleit, Kain, Gibbons, Gutman, Bongini & Bianco P.L.

(57) ABSTRACT

A Phase-Locked Loop is provided that includes a main loop, a calibration loop, and Control Logic. The main loop comprises, coupled in series, a Phase Frequency Detector, a Main Charge Pump, a Main Loop Filter, a Voltage Controlled Oscillator and a Frequency Divider. The calibration loop is coupled to the Phase Frequency Detector and comprises a Calibration Charge Pump and a Calibration Loop Filter. The Control Logic controls the Frequency Divider and receives a control input signal. A Reference Frequency Signal is coupled to the Phase Frequency Detector and the Control Logic, and a calibration signal is coupled to the calibration loop. Additionally, the main loop further comprises a delay generator controlled by the Control Logic and arranged to receive correction signals from the calibration loop and to send an output signal to the Phase Frequency Detector.

17 Claims, 2 Drawing Sheets

DELAY-COMPENSATED FRACTIONAL-N FREQUENCY SYNTHESIZER

CROSS-REFERENCE TO RELATED APPLICATIONS

This application is based upon and claims priority from European Patent Application No. 02-447268.0, filed Dec. 23, 2002, the entire disclosure of which is herein incorporated by reference.

FIELD OF THE INVENTION

The present invention is related to a fractional-N frequency synthesizer based on a Phase-Locked Loop, commonly used in digital communication systems.

BACKGROUND OF THE INVENTION

The generation of the Local Oscillator (LO) carriers used in radio transceivers is usually done with a phase-locked loop (PLL). With this circuit, an output frequency can only be an integer multiple of a reference frequency ($F_{out}=N \times F_{ref}$), which implies this reference frequency cannot be higher than the channel spacing. This limits the PLL bandwidth to approximately one tenth of the channel spacing, which implies settling times are sometimes too long.

Also, the required frequency resolution sometimes is just too small to synthesize it as an integer multiple of a reference crystal.

A fractional-N synthesizer does not have a constant value for the PLL division ratio N, but instead it toggles between two or more integer values, resulting in a non-integer average division ratio. Therefore, the reference frequency can be chosen freely and constraints on the loop bandwidth disappear. This toggling however introduces noise, which can be compared to the quantization noise in an Analog-to-Digital converter (ADC).

Therefore, all known fractional-N synthesizers use a sigma-delta modulator to decide on the actual division ratio N. As in a sigma-delta ADC, this modulator shapes the noise introduced by toggling to higher frequencies, where it can be removed by the low-pass filtering action of the PLL loop. For more information on this, see "Delta-Sigma Modulation in Fractional-N Frequency Synthesis", IEEE Journal of Solid-State Circuits, vol. 28, no. 5, May 1993, pp. 553–559, which is herein incorporated by reference.

Although the loop bandwidth is no longer limited by the small reference frequency, the loop filter must remove the delta-sigma noise that has been shaped away from the low frequencies to the high frequencies. This requires a lot of filtering, generally resulting in a loop bandwidth as small as with an integer-N PLL and with high-order filters. As these filters are too big to be integrated on chip, they are implemented as external components, resulting in higher cost.

SUMMARY OF THE INVENTION

In view of these drawbacks, it is an object of the present invention to overcome the above-mentioned drawbacks and to provide a device that synthesizes a fractional-N frequency based on a Phase-Locked Loop, in which the loop filter does not have to carry out strong filtering to remove the noise introduced by the fractional-N division operation.

One embodiment of the present invention provides a Phase-Locked Loop that includes a main loop, a calibration loop, and Control Logic. The main loop comprises, coupled in series, a Phase Frequency Detector, a Main Charge Pump, a Main Loop Filter, a Voltage Controlled Oscillator and a Frequency Divider. The calibration loop is coupled to the Phase Frequency Detector and comprises a Calibration Charge Pump and a Calibration Loop Filter. The Control Logic controls the Frequency Divider and receives a control input signal. A Reference Frequency Signal is coupled to the Phase Frequency Detector and the Control Logic, and a calibration signal is coupled to the calibration loop. Additionally, the main loop further comprises a delay generator controlled by the Control Logic and arranged to receive correction signals from the calibration loop and to send an output signal to the Phase Frequency Detector.

In a preferred embodiment of the present invention, the delay generator comprises a current-starved inverter whose current is controlled by a current mirror through switches. The current is proportional to a biasing current that is adjusted by the calibration loop. Preferably, the Control Logic comprises a delta-sigma modulator.

A further embodiment of the present invention provides a fractional-N frequency synthesizer comprising such a PLL.

Another embodiment of the present invention provides an integrated circuit comprising such a PLL.

Still another embodiment of the present invention provides a digital radio communication apparatus comprising such a Phase-Locked Loop.

Yet another embodiment of the present invention provides a method for synthesizing frequencies with such a Phase-Locked Loop. According to the method, at least one such Phase-Locked Loop is provided. A reference frequency signal is coupled to the Phase Frequency Detector of the Phase-Locked Loop and to the Control Logic. A calibration signal is coupled to the calibration loop of the Phase-Locked Loop, and a control input signal is coupled to the Control Logic to indicate the frequency to be synthesized.

Other objects, features and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

The basic principle applied in embodiments of the present invention is that the fractional 'quantization' noise is not shaped to higher frequencies, but cancelled out before it enters the Phase-Frequency Detector (PFD). In that way the loop filter does not have to filter it and the consequences on the PLL bandwidth are gone. The preferred implementation of this noise cancellation is based on delay cells added after the Frequency Divider.

Figure 1:
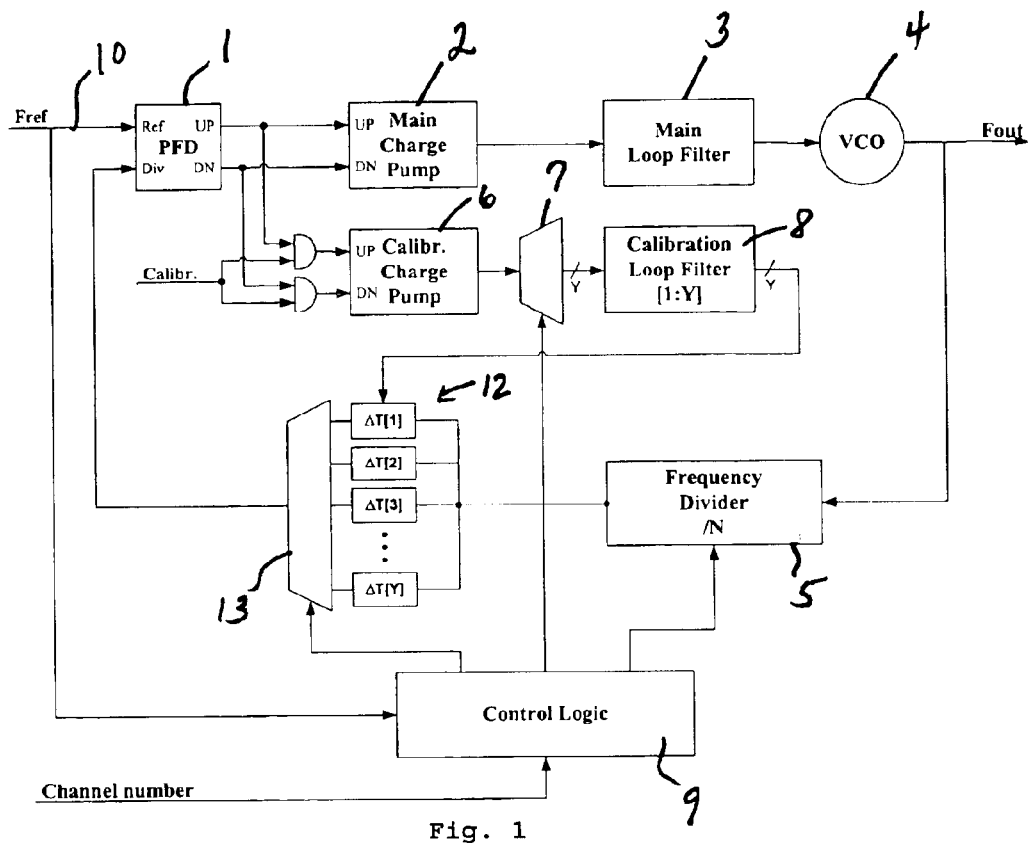
FIG. 1 represents a basic fractional noise removal scheme.

An intermediate step toward the present invention is presented in FIG. 1. As shown, a main loop comprises, coupled in cascade, a Phase Frequency Detector (PFD) 1, a Main Charge Pump 2, a Main Loop Filter 3, a Voltage Controlled Oscillator (VCO) 4 and a Frequency Divider 5. A case in which a frequency $$F_{out}=(N+X/Y) \times F_{ref}$$

must be synthesized, where N, X, and Y are integers, will now be described. The number n=N+X/Y is passed to the control block 9, which generates a sequence of division ratios. This sequence consists of X times the ratio N+1, and Y−X times the ratio N. This sequence has a length Y 'blocks' and repeats itself. With a normal Phase-Locked Loop, this action would result in an output spectrum severely disturbed by fractional spurs. To remove those, a calibration loop is inserted. This loop comprises the series connection of a Calibration Charge Pump 6, a Multiplexer 7 and Y Calibration Loop Filters 8, with Y still being an integer. The output of the Calibration Loop Filters is connected to a phase-adjusting block 12. The Control Logic 9 then selects the correct Loop Filter [1:Y] 8, based on the state the Frequency Divider 5 is in. This is done with the Multiplexer 7 following the calibration charge pump 6. A Reference Frequency Signal 10 is applied to the Phase Frequency Detector 1 and to the Control Logic 9.

As the division ratios are periodical with a period of Y 'blocks', the phase differences, which would normally appear at the Phase-Frequency Detector (PFD) 1 input, are in fact known. They are also repetitive with a period Y. Suppose the reference and divide signal start with their edges a time $\Delta T_Y$ apart and the first time the division ratio is N. The next edge of the frequency divider 5 output will arrive after N periods of the output frequency. This is in fact too soon with respect to the reference signal, because this edge will arrive by definition after N+X/Y periods of the output frequency. The phase error made that way will be given by the following.

$$\Delta T_1 = \Delta T_Y + (X/Y)^* T_{out} (\text{with } T_{out} = 1/F_{out})$$

Figure 2:
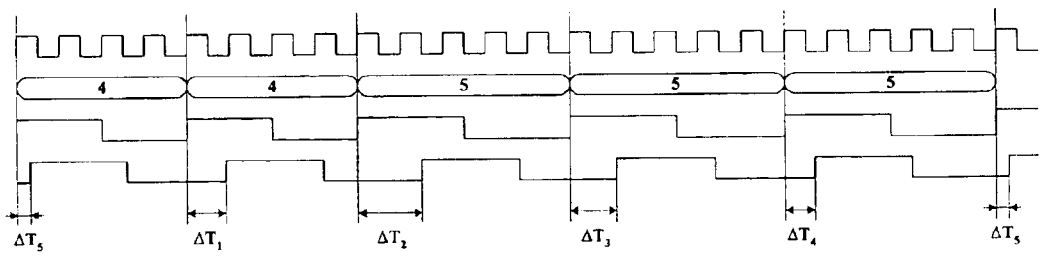
FIG. 2 represents the delay timing for N=4, X=3, and Y=5.

A timing example for N=4, X=3 and Y=5 is shown in FIG. 2.

The control logic 9 must also select in the phase-adjusting block 12 the corresponding low-frequency delay cell $\Delta T[1:Y]$ that is associated with the phase to be calibrated. Therefore, it must set the demultiplexer 13 in the divider frequency path such that it selects the output of the delay cell number 1. In the mean time, one must be able to adjust the amount of delay generated in this cell through the calibration charge pump and loop filters, so also the loop filter number 1 must be activated by the control block through the multiplexer.

It is indeed possible to calibrate the delay of delay cell number 1 to its required value, because the amount of phase difference between the reference and the divided frequency is reflected in the charge pumped out by the calibration charge pump 6.

So, while the control block 9 repeats its division ratio sequence of length Y, the multiplexer 7 sequentially calibrates delay cells 1, 2, . . . , Y, while the demultiplexer 13 sequentially selects delay cells 1, 2, . . . , Y. Once the calibration loops are settled, the Phase-Frequency Detector (PFD) 1 will only see perfectly aligned reference and divider signals, and no spurious signals will appear in the output spectrum.

In order to limit the amount of hardware needed for implementation, the value of Y preferably is not too big. Further, the calibration loop bandwidth must be an order of magnitude smaller than the main loop bandwidth in order to not disturb the main loop locking behavior. Therefore, the average frequency will be able to settle fast, but its spectrum will not be useful before the calibration loop is settled, which takes 10 times longer.

Figure 3:
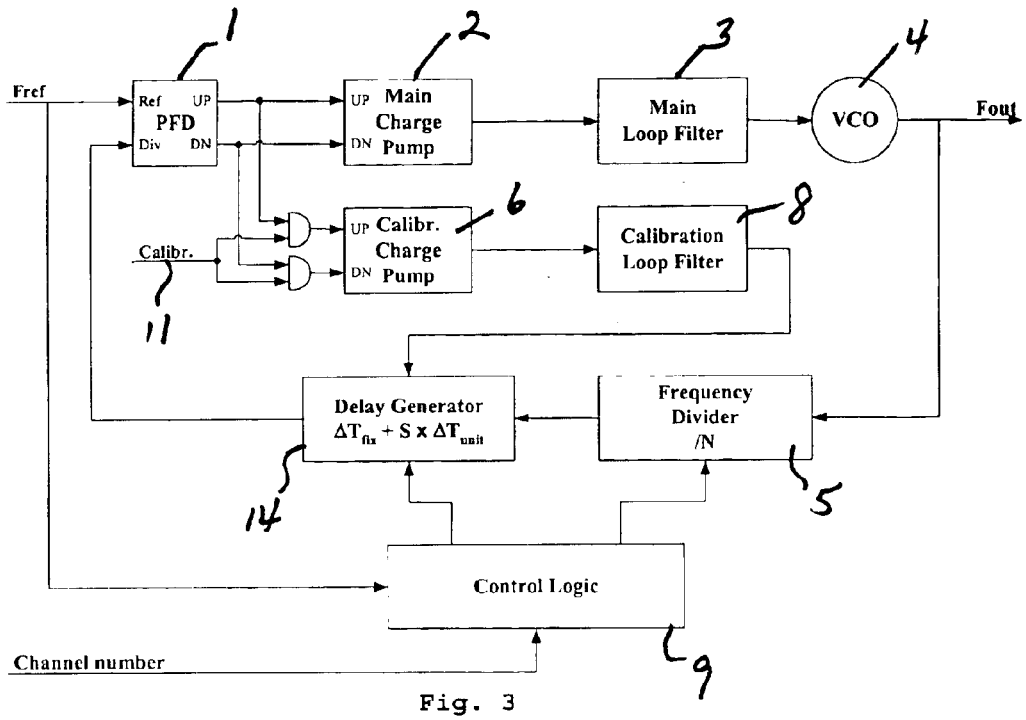
FIG. 3 represents a fractional noise removal scheme according to a preferred embodiment of the present invention.

A preferred embodiment of the present invention is shown in FIG. 3. The basic idea is based on the fact that the delays $\Delta T_1 \ldots _Y$ to be created to remove the fractional spurs are always a multiple of the unit delay $\Delta T_{unit} = T_{out}/Y$. Referring for example to FIG. 2, one can see the following.

$$\Delta T_1 = \Delta T_{fix} + 3 \cdot \Delta T_{unit}$$

$$\Delta T_2 = \Delta T_{fix} + 6 \cdot \Delta T_{unit}$$

$$\Delta T_3 = \Delta T_{fix} + 4 \cdot \Delta T_{unit}$$

$$\Delta T_4 = \Delta T_{fix} + 2 \cdot \Delta T_{unit}$$

$$\Delta T_5 = \Delta T_{fix} + 0 \cdot \Delta T_{unit}$$

More generally, if the division ratio is N, then $$\Delta T_i = \Delta T_{i-1} + X \cdot \Delta T_{unit}$$

else if the division ratio is N+1, then $$\Delta T_i = \Delta T_{i-1} - (Y-X) \cdot \Delta T_{unit}$$

So the delay is always given by an expression of the following form.

$$\Delta T_i = \Delta T_{fix} + S \cdot \Delta T_{unit}$$

So the Control Logic 9 in FIG. 3 should generate the correct sequence of division ratios for the frequency divider to make an average ratio of n=N+X/Y and at the same time provide the delay generator block 14 with the correct number S of unit delays to insert in the frequency divider output.

At the same time, a calibration loop is active that uses the information present in the outputs of the Phase-Frequency Detector (PFD) 1 and a calibration signal 11 to drive the calibration charge pump 6 and the calibration loop filter 8'. This loop will automatically tune the unit delay of the delay generator 14 to the correct value.

There is no longer any need for a repetitive sequence of length Y for the division ratios. Any sequence will do, and the only thing the control block needs to do is to adjust the correct number S of unit delays. The sequence may even be generated by a delta-sigma modulator.

Figure 4:
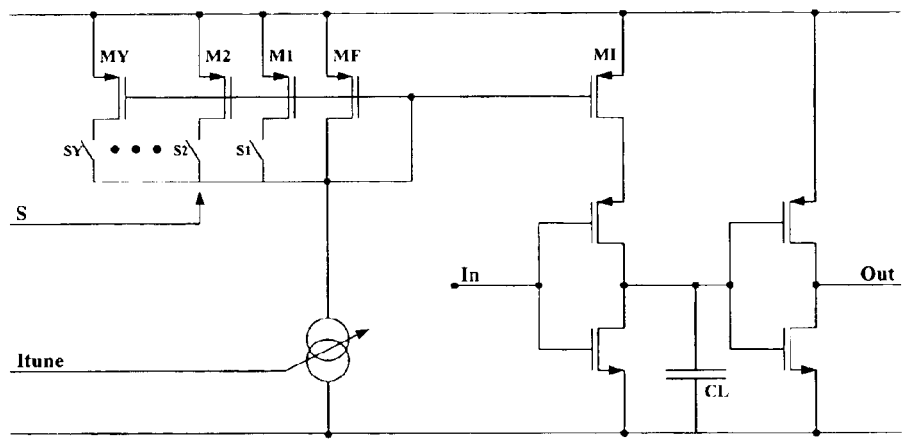
FIG. 4 represents a delay generator schematic.

One possible implementation for a delay generator circuit is shown in FIG. 4. It is based on the propagation delay of a current-starved inverter. The total current available to charge the load capacitor is proportional to the biasing current $I_{tune}$. This biasing current is the one that is adjusted by the calibration loop. On top of that, the PMOS current mirror on top can control the final current for the inverter through the switches S1, S2 . . . SY. The transistors in this current mirror are sized such that M1, M2 . . . MY have the same size and both MF and MI are a fixed factor F times bigger. To make a delay of S times $\Delta T_{unit}$, S of these switches are closed. The total current delivered to the inverter available to charge the load CL is then equal to the following.

$$I_{charge} = I_{tune} \times \frac{F}{F+S}$$

Ideally, the delay is inversely proportional to the charge current, leading here to the desired behavior that the delay is proportional to S. The size of F determines the fixed delay.

The present invention has the advantage of avoiding the need for excessive noise filtering by the loop filter, hence it allows an easy integration. The calibration bandwidth still must be an order of magnitude lower than the main loop bandwidth, leading to longer settling times. However, as the value of $\Delta T_{unit}$ will not change very much from one channel to another, this effect is not important.

The present invention can be realized in hardware, software, or a combination of hardware and software. Any processor, controller, or other apparatus adapted for carrying out the functionality described herein is suitable. A typical combination of hardware and software could include a general purpose processor (or a controller) with a computer program that, when loaded and executed, carries out the functionality described herein.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A Phase-Locked Loop comprising:
   a main loop comprising, coupled in series, a Phase Frequency Detector, a Main Charge Pump, a Main Loop Filter, a Voltage Controlled Oscillator and a Frequency Divider;
   a calibration loop coupled to the Phase Frequency Detector, the calibration loop comprising a Calibration Charge Pump and a Calibration Loop Filter; and
   control Logic for controlling the Frequency Divider, the Control Logic receiving a control input signal,
   wherein a Reference Frequency Signal is coupled to the Phase Frequency Detector and the Control Logic,
   a calibration signal is coupled to the calibration loop, and
   the main loop further comprises a delay generator controlled by the Control Logic and arranged to receive correction signals from the calibration loop and to send an output signal to the Phase Frequency Detector.

2. The Phase-Locked Loop as defined in claim 1, wherein the delay generator comprises a current-starved inverter whose current is controlled by a current mirror through switches, the current being proportional to a biasing current adjusted by the calibration loop.

3. The Phase-Locked Loop as defined in claim 2, wherein the Control Logic comprises a delta-sigma modulator.

4. The Phase-Locked Loop as defined in claim 1, wherein the Control Logic comprises a delta-sigma modulator.

5. A fractional-N frequency synthesizer comprising the Phase-Locked Loop as defined in claim 1.

6. The fractional-N frequency synthesizer as defined in claim 5, wherein the delay generator of the Phase-Locked Loop comprises a current-starved inverter whose current is controlled by a current mirror through switches, the current being proportional to a biasing current adjusted by the calibration loop.

7. The fractional-N frequency synthesizer as defined in claim 5, wherein the Control Logic of the Phase-Locked Loop comprises a delta-sigma modulator.

8. An integrated circuit comprising the Phase-Locked Loop as defined in claim 1.

9. The integrated circuit as defined in claim 8, wherein the delay generator of the Phase-Locked Loop comprises a current-starved inverter whose current is controlled by a current mirror through switches, the current being proportional to a biasing current adjusted by the calibration loop.

10. The integrated circuit as defined in claim 8, wherein the Control Logic of the Phase-Locked Loop comprises a delta-sigma modulator.

11. A digital mobile radio communication apparatus including at least one Phase-Locked Loop, said Phase-Locked Loop comprising:
    a main loop comprising, coupled in series, a Phase Frequency Detector, a Main Charge Pump, a Main Loop Filter, a Voltage Controlled Oscillator and a Frequency Divider;
    a calibration loop coupled to the Phase Frequency Detector, the calibration loop comprising a Calibration Charge Pump and a Calibration Loop Filter; and
    control Logic for controlling the Frequency Divider,
    wherein a Reference Frequency Signal is coupled to the Phase Frequency Detector and the Control Logic,
    a calibration signal is coupled to the calibration loop, and
    the main loop further comprises a delay generator controlled by the Control Logic and arranged to receive correction signals from the calibration loop and to send an output signal to the Phase Frequency Detector.

12. The digital mobile radio communication apparatus as defined in claim 11, wherein the delay generator of the Phase-Locked Loop comprises a current-starved inverter whose current is controlled by a current mirror through switches, the current being proportional to a biasing current adjusted by the calibration loop.

13. The digital mobile radio communication apparatus as defined in claim 12, wherein the Control Logic of the Phase-Locked Loop comprises a delta-sigma modulator.

14. The digital mobile radio communication apparatus as defined in claim 11, wherein the Control Logic of the Phase-Locked Loop comprises a delta-sigma modulator.

15. A method for synthesizing frequencies with a Phase-Locked Loop, said method comprising the steps of:
    providing at least one Phase-Locked Loop that includes:
      a main loop comprising, coupled in series, a Phase Frequency Detector, a Main Charge Pump, a Main Loop Filter, a Voltage Controlled Oscillator and a Frequency Divider;
      a calibration loop coupled to the Phase Frequency Detector, the calibration loop comprising a Calibration Charge Pump and a Calibration Loop Filter; and
      control Logic for controlling the Frequency Divider,
      wherein the main loop further comprises a delay generator controlled by the Control Logic and arranged to receive correction signals from the calibration loop and to send an output signal to the Phase Frequency Detector;
    applying a reference frequency signal to the Phase Frequency Detector of the Phase-Locked Loop and to the Control Logic;
    applying a calibration signal to the calibration loop of the Phase-Locked Loop; and
    applying a control input signal to the Control Logic to indicate the frequency to be synthesized.

16. The method as defined in claim 15, wherein the delay generator comprises a current-starved inverter whose current is controlled by a current mirror through switches, the current being proportional to a biasing current adjusted by the calibration loop.

17. The method as defined in claim 15, wherein the Control Logic comprises a delta-sigma modulator.

* * * * *